(12) United States Patent
Cappelletti et al.

(10) Patent No.: US 7,304,485 B2
(45) Date of Patent: Dec. 4, 2007

(54) ANALYSIS OF THE QUALITY OF CONTACTS AND VIAS IN MULTI-METAL FABRICATION PROCESSES OF SEMICONDUCTOR DEVICES, METHOD AND TEST CHIP ARCHITECTURE

(75) Inventors: Paolo Cappelletti, Seveso (IT); Alfonso Maurelli, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 561 days.

(21) Appl. No.: 10/850,834

(22) Filed: May 21, 2004

(65) Prior Publication Data
US 2004/0268275 A1 Dec. 30, 2004

(30) Foreign Application Priority Data
May 23, 2003 (EP) .................................. 03425336

(51) Int. Cl.
*G01R 31/28* (2006.01)
(52) U.S. Cl. .................. 324/719; 324/765; 324/525
(58) Field of Classification Search ................ 324/538, 324/537, 719, 525; 257/48; 438/18
See application file for complete search history.

(56) References Cited
U.S. PATENT DOCUMENTS

| 5,811,977 | A | * | 9/1998 | Rouchard | ................... | 324/538 |
|---|---|---|---|---|---|---|
| 5,844,850 | A | * | 12/1998 | Tsutsui et al. | ............... | 365/200 |
| 6,175,125 | B1 | * | 1/2001 | Tsai | ............................ | 257/48 |
| 6,475,871 | B1 |  | 11/2002 | Stine et al. | .................. | 438/381 |
| 6,704,609 | B1 | * | 3/2004 | Shen | .......................... | 700/121 |
| 6,933,730 | B2 | * | 8/2005 | Parker et al. | ................ | 324/538 |
| 6,948,105 | B2 | * | 9/2005 | Rajsuman | .................... | 714/724 |
| 2005/0257086 | A1 | * | 11/2005 | Triou et al. | .................... | 714/25 |
| 2006/0022678 | A1 | * | 2/2006 | Hegazy et al. | .............. | 324/525 |

FOREIGN PATENT DOCUMENTS

| JP | 200305121 | 2/2003 |
|---|---|---|
| WO | 03/012857 | 2/2003 |

\* cited by examiner

*Primary Examiner*—Anjan Deb
(74) *Attorney, Agent, or Firm*—Lisa K. Jorgenson; Allen, Dyer, Doppelt, Milbrath & Gilchrist, P.A.

(57) ABSTRACT

A test chip performs measurements to evaluate the performances of interconnects. In particular, the statistical failure distribution, the electromigration and the leakage current are measured. An algorithm detects a via failure at any of the available n metal layers. The test chip includes a ROM memory array. The vias to be measured are formed in the columns of the array. Via or contact failures are detected by forcing a predetermined current through both an array column and a reference column. The failure analysis is obtained by comparing the resulting voltage drops.

21 Claims, 4 Drawing Sheets

FAILURE DIAGRAM

ANALYSIS OF THE QUALITY OF CONTACTS AND VIAS IN MULTI-METAL FABRICATION PROCESSES OF SEMICONDUCTOR DEVICES, METHOD AND TEST CHIP ARCHITECTURE

FIELD OF THE INVENTION

The present invention relates in general to the technologies for fabricating integrated circuits, and more particularly, to the techniques for assessing the quality of contacts and vias (interconnects) that are obtained with certain layouts and processing steps in developing new integration processes.

BACKGROUND OF THE INVENTION

In accordance with the well-known "Moore's law", first formulated in 1965 [1], [2], integration density has doubled approximately every 18 months during the last 25 years. The related Technology Roadmap for Semiconductors (TRS) predicts, for microprocessors, that the number of transistors per chip will be about a billion in 2010 [3], [4].

The main reason of such a trend is an endless feature size reduction. In this scenario, the realization of electrical interconnections (contacts and vias), also referred to as interconnects, becomes more and more critical, and represents a limit to the scaling-down trend.

In particular, as circuit complexity increases (e.g., realization of complete systems on a chip or SOC), the number of interconnects also increases. The shrinking of transistor dimensions forces interconnect sizes to shrink as well (to fully exploit the increase in circuit density obtained with the feature size reduction). Moreover, for any chip, the electric performance depends on the behavior of all devices: transistors, capacitors, resistors, and interconnects as well.

Interconnects suffer from several possible types of failure. Most critical are the so-called "open-failures" at the contact and at the via level. An open-failure may signify a chip failure (this is generally the case of logic and memory chips). Of course, the larger the number of interconnects, the higher is the probability of having a chip failure due to interconnect failures.

Several phenomena can cause a failure across an interconnect, the most usual being a process fault (open-failure at time zero) and electromigration (failure during operation) [5]-[7]. The probability of both mechanisms of failure is inversely proportional to the size of contacts and vias. For the above reasons, in modern processing, manufacturing yield and circuit reliability become increasingly dependent on interconnects.

Of course, the basic requirements of interconnects are low resistance, stability during the fabrication process, and reliability during operation. Furthermore, interconnects (in particular, contacts and vias) must show a good adhesion to the underlying layer. So far, aluminium (or an aluminium-based alloy) has been the most used conductor to form interconnects in integrated silicon technology.

Aluminium (Al) processes have evolved to improve interconnect yield and reliability. The biggest problem in Al interconnects is represented by electromigration, which arises in the presence of an excessively high current density. At present, copper (Cu) is emerging as the leading conductor for interconnects due to its lower resistivity (1.7 $\mu\Omega\cdot$cm vs. 2.7 $\mu\Omega\cdot$cm) and its better immunity to electromigration.

In addition, the use of copper interconnects allows thinner and more closely spaced wires than Al-based technologies.

Nevertheless, it must be pointed out that copper has several disadvantages. Above all, copper is more difficult to etch, thus requiring manufacturers to adopt new process steps. Moreover, it must be encapsulated with barrier materials for reliable integration with existing backend oxide dielectrics.

Several phenomena must be investigated to settle copper-based interconnect technology. For instance, in the presence of an electric field at temperatures as low as 150° C., positive Cu ions drift rapidly through silicon dioxide, thus degrading field isolation (by inducing dielectric leakage) and even active devices.

Furthermore, due to the continuous current density increase, electromigration and new process failures of vias and contacts represent a very critical issue. The dependence of these failures on the C/V aspect ratio must be analyzed. Some mechanisms for copper via failure have been reported [8]. One or more small voids can be present in the metallic copper that forms the via. The voids can join and migrate to the bottom of the via through either electromigration or, more critically, thermal-stress migration, thus opening the connection between the via and the barrier over the underlying metal layer. In some cases, thermal stress can be so great that the via metal tears away from the barrier material, thus forming a void and opening the connection.

A further possible drawback in scaled-down devices is represented by the leakage current between adjacent metal lines (belonging either to the same level or to different levels). As mentioned above, the use of copper can lead to oxide contamination. The ensuing leakage current can both contribute to increase the power consumption and decrease manufacturing yield. This aspect also needs also to be experimentally analyzed.

For the above reasons, to improve the performance of interconnects (to be more specific, of contacts and vias) it is fundamentally mandatory to use a test chip able to experimentally evaluate their behavior. Moreover, because of the many metal layers that are used in modern processes, the test system should be able to detect open-failures between any pair of adjacent metal levels of the test chip. Indeed, it would be desirable to obtain the statistical failure distribution for any different via level, so as to be able to improve the manufacturing process at every step.

Due to the statistical nature of failures, a large amount of experimental data is needed. The time to perform all the necessary measurements should be kept as low as possible. The above requirements represent a key design constraint for any suitable test device [9], [10]. Furthermore, to reduce testing time and cost, it would be desirable to have a test chip that allows all the above measurements. To improve the fabrication process, a detailed physical analysis of the detected failures must eventually be carried out. Because the number of failures is relatively small, the location of any failed element should be exactly determined.

SUMMARY OF THE INVENTION

An object of the present invention is to provide a test system that is based on the use of a pyramidal arrangement of the electrical paths from a contact on the semiconductor substrate (level 0) to the topmost metal (level n) though all the metal levels of a test chip. The electrical characteristics are measured to identify and precisely locate any faulting contact or via (C/V failures) that affects the electrical characteristics of a certain path.

The core of the test system is an array of AND connected transistors forming a ROM array where all the bit cells are customarily fabricated in a certain logic state. That is, any addressed transistor will conduct unless affected by a faulty contact or via that may impede its turning on when addressed. The pyramidal arrangement of interconnects is such that any of the addressing (biasing) electrical paths from a contact to the topmost metal level includes vias through all the metal levels. An algorithm permits identification of the contact or the via that is responsible for a detected augmented resistance of the electric path.

The contacts/vias to be experimentally analyzed are placed across the bit-lines of the array. Via (or contact) failures are detected by forcing a predetermined current through both an array bit-line and an adequate reference bit-line. The required failure evaluation is attained by comparing the resulting voltage drops.

By choosing a threshold resistance $R_{th}$, it is possible to classify the whole contacts and vias population in two classes. In other words, a resistance larger than $R_{th}$, is deemed to represent an interconnect fault and can be represented by a certain logic state. That is, the corresponding cell of the test array stores an equivalent logic value, for example a 1. For these reasons, contacts and vias can be analyzed similarly to cells of a ROM array.

For any fabrication process, the statistical distribution of C/V resistance can generally be approximated with a diagram such as the one in FIG. 1. As observed, the overall C/V population can be divided in two basic groups. The C/Vs in the first group (that includes the great majority of the elements) have a low resistance. For instance, from several ohms to a few tens of ohms. These elements represent the working C/Vs. Some elements with a resistance of up to several MΩs are assumed to be present due to process (or operation-induced) failures. These elements, which are referred to as failed C/Vs, represent the second group in FIG. 1. The number of failed elements is typically very small as compared to the number of working elements.

The basic hypothesis that has been adopted in devising the test chip is as follows. Because the number of failed interconnects (C/Vs) is very low, it may be assumed that the probability of having two failures in any given reasonably small silicon area of a chip is almost zero.

DETAILED DESCRIPTION OF THE PREFERRED EMBODIMENTS

Figure 1:
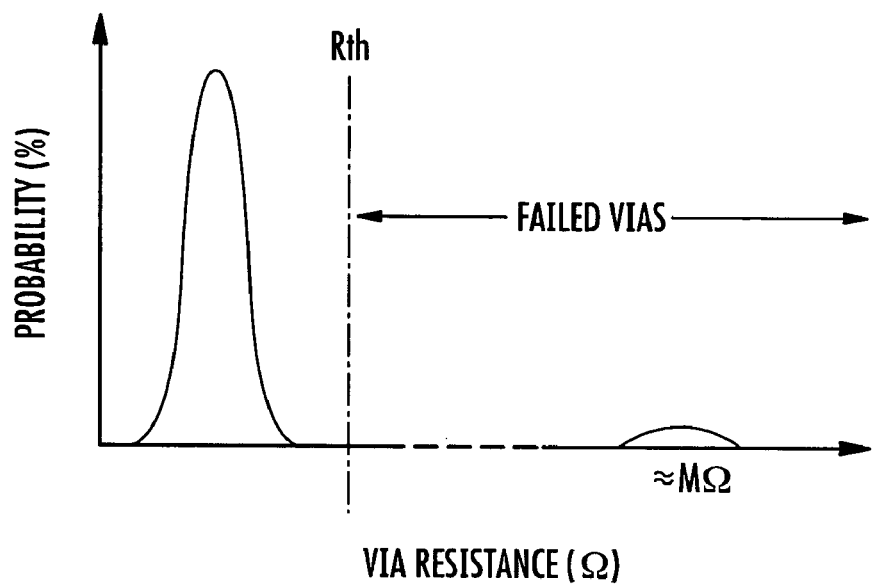
FIG. 1 shows typical statistical distribution curves of interconnect resistance values according to the prior art.
Figure 2:
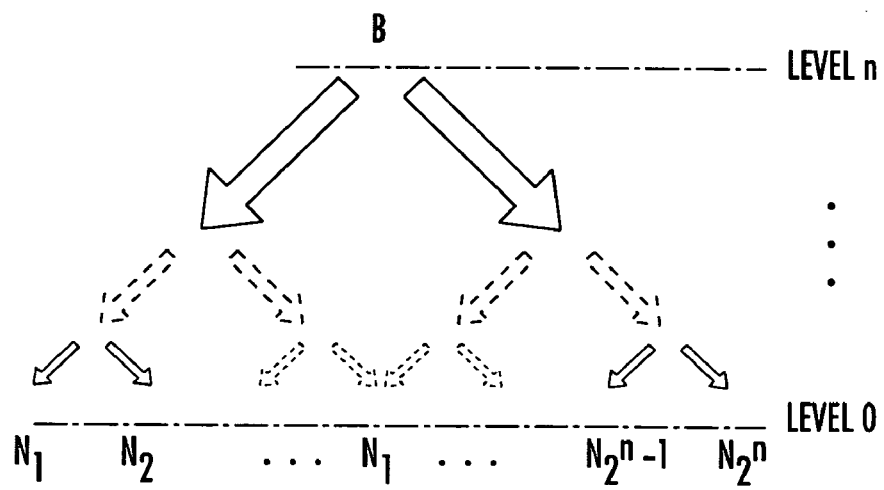
FIG. 2 shows the pyramidal diagram of an electrical path through the n metal levels of a test chip according to the present invention.

Based on the above assumption, a basic pyramidal test scheme as schematically depicted in FIG. 2 makes it possible to detect an interconnect failure at any level. Each level 1 to n represents a metal layer except for the bottom level 0, which represents the active silicon area.

The nodes of the illustrated arrow tree diagram represent C/Vs between adjacent conductive layers. The proposed structure includes an (n+1) level pyramidal topology, where n is the number of metal layers of the fabrication process under evaluation. The electrical path between any node Nj ($1 \leq j \leq 2^{n-1}$) and node B includes one interconnect element for any C/V level. Any zero-level contact belongs to one only path, while any i-th level via is included in $2^i$ adjacent paths. As a result, a failure in any i-th level C/V (i.e., any contact or via between the i-th and the (i+1)-th interconnection layer affects the path between node B and $2^i$ adjacent nodes $N_j$ and, hence, its overall resistance.

It is evident that it is possible to detect if an interconnect failure is present in any path Pj between B and $N_j$ by simply measuring the resistance between the two nodes. Moreover, by measuring the resistance of all the paths connected to node B, the exact location of the failed element (if any) can be identified, assuming that a single failure is present in the basic structure.

Figure 3:
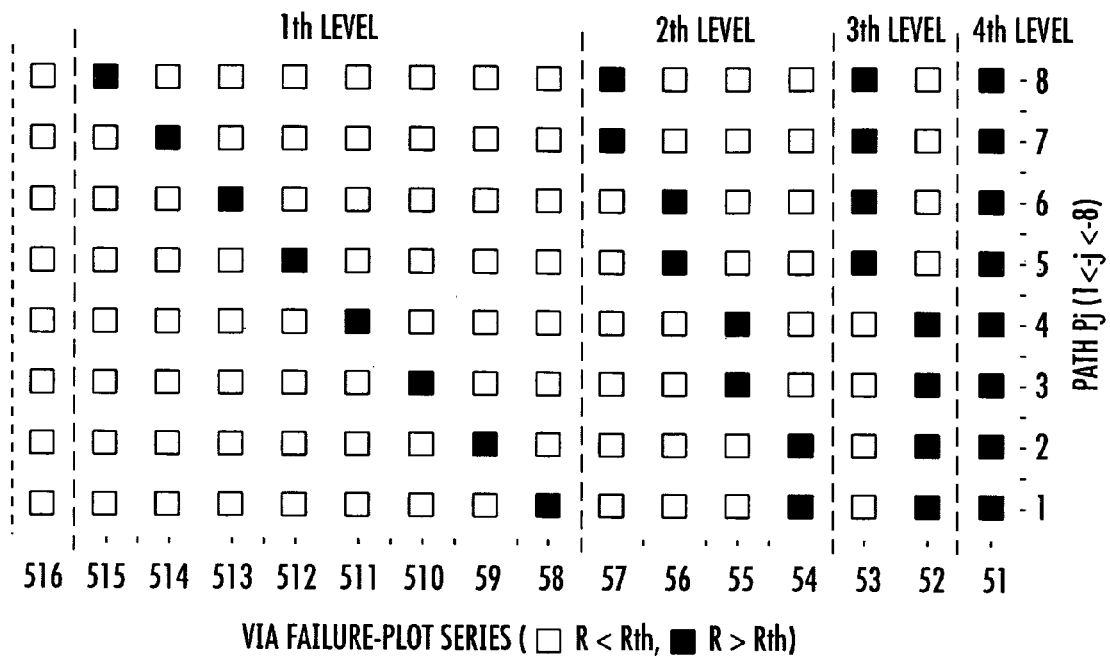
FIG. 3 shows a failure diagram obtained with the test system according to the present invention.

To be specific, FIG. 3 depicts the possible test results obtained when sequentially scanning all the $2^{n-1}$ paths. For simplicity, the case of a four-metal layer technology is considered. Any column in the figure represents a possible sequence of the test results referred to each individual path. A black square=a failed path (i.e., high-resistance), and a non-filled square=a working path (i.e., low-resistance).

Sequence $S_{15}$ represents the case when all paths are working. Sequences $S_{14}$ to $S_7$ correspond to the presence of a failure at the zero contact level, i.e., at the metal 1-to-active area contact level. Each sequence corresponds to a different location from the first to the eighth of the failed contact.

Sequences $S_6$ to $S_3$ refer to the case of a failure at the first via level (metal 2 to metal 1). Sequences $S_3$ and $S_2$ represent a failure at the second via level (metal 3 to metal 2). Finally, sequence 1 (all paths failed) corresponds to the failure at the highest via level.

It is clear that, for any measured structure, the location of the failed C/V can be easily identified by looking at the failure plot. This allows the subsequent physical failure analysis to be carried out. The above considerations can be easily extended for any value of n. In the general case, the number of possible test result sequences is given by:

$$F = 1 + \sum_{i=0}^{n-1} 2^i. \quad (1)$$

For the considered case of a four-metal process, the core of the proposed test chip may be an array of 8 sectors, each made up of 64×1024 elementary pyramidal structures, which can be regarded as a ROM array. Each contact and via in the array (i.e., any node of the basic tree-diagram of FIG. 2) is a memory cell, wherein the stored information is the presence or the absence of an interconnect failure.

Any of the 1024 bit-line runs in the n-th metal layer (in our case, n=4), includes 64 pyramidal structures and, hence, 512 zero-level contacts and 511 vias, for a total of about 0.5M contacts and 0.5M vias per sector. Each basic structure is obviously placed so as to lie under the associated bit-line.

During a read operation, the required path (from the addressed bit-line to the desired node $N_j$) is selected through a transistor whose gate is driven by a polycide stripe. These stripes represent the array word-lines (WLs).

Figure 4:
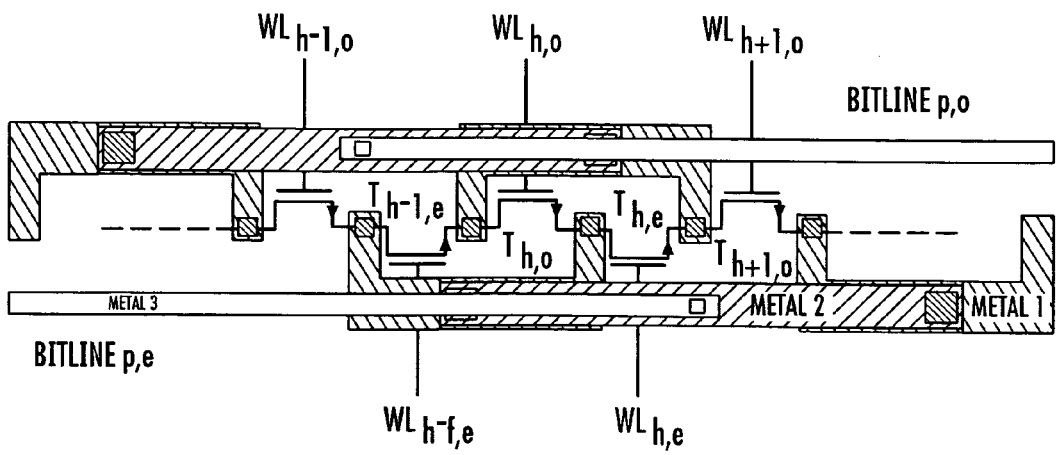
FIG. 4 shows a circuit implementation of the pyramidal-scheme of interconnects in a test chip for a three-metal integration process according to the present invention.

To increase the number of contacts per unit area, in the test chip the bit-lines of any sector may be grouped in 512 pairs, and an interleaved approach may be followed for the zero-level contacts of any pair of bit-lines p,o and p,e ($1 \leq p \leq 512$, o=odd, e=even). A detail of a bit-line pair defined in the third level metal (metal 3) is illustrated in FIG. 4.

The selection transistor ($T_{h,o}$, $1 \leq h \leq 256$) associated to any given path $P_{h,o}$ in an odd bit-line, connects the corresponding node $N_{h,o}$ to the neighboring node $N_{h,e}$ of the corresponding even bit-line rather than to ground, so that the number of available contacts (and, hence, of paths $N_j$) is maximized.

The same consideration applies to selection transistors ($T_{h,e}$) associated to paths $P_{h,e}$ in the even bit-line. The decoders for "odd" and "even" word-lines ($WL_{h,o}$, and $WL_{h,e}$, respectively) may be placed at the two opposite sides of the array, to relax pitch requirements of their final stages.

With an organization as described above, during a reading operation, the resistance of two series-connected paths $P_{h,o}$, and $P_{h,e}$ is measured. It must be noted that, in this way, two zero-level contacts are included in a complete current path.

To allow contact failure detection at node $N_{h,o}$ ($N_{h,e}$), both selection devices connected to this node, i.e., $T_{h-1,e}$ and $T_{h,o}$ ($T_{h,o}$ and $T_{h,e}$), are activated by their respective word-lines. In this way, a redundant path is introduced, which places two zero-level contacts of the even (odd) bit-line in parallel.

For example, in an H8 type process, if the width W of a transistor is 1μ, access to the relative single contact takes place through the equivalent resistance of 2μ of a minimum channel length. For n-channel transistors this is equal to about 2KΩ, and for p-channel transistors this is equal to about 5KΩ. In practice, these values define the limit of sensitivity.

If a greater sensitivity is desired, width W of the array transistors must be increased by decreasing the number of transistors of the test array, and thus restricting the statistical sample for a given area dedicated to the integration of the test array structure in the test chip.

Of course, the test chip may be and will normally be provided with typical test mode circuitries of flash memory chips (i.e., read, DMA, FAST DMA) and it will be preferable to use reference array cells as it is normally done in common ROM and EPROM devices.

Because two series-connected paths are simultaneously assessed, to determine the location of a failure (if any) it is necessary to determine if the failure is related to the odd or the even bit-line. Actually, the basic topology becomes that of a pair of interleaved pyramidal structures, each referring to $2^n$ word-lines. As a consequence, the number of possible test result sequences $S_i$ is given by:

$$F = 1 + (1 + 2^{n-1}) + 2 \sum_{i=0}^{n-2} 2^i. \quad (2)$$

Figure 5:
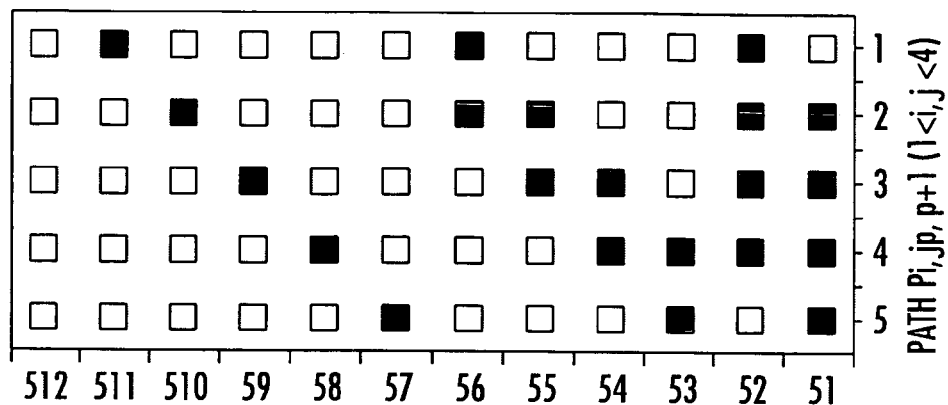
FIG. 5 shows a failure diagram in the case of an interleaved pyramidal architecture as shown in FIG. 4.

FIG. 5 illustrates the corresponding failure diagram. For simplicity, three metal layers have been assumed. The correct failure evaluation can be performed as follow. The subset $S_{i,e}$ (i=2k, $1<k<2^n-1$) refers to failures of even bit-lines whereas the subset $S_{i,o}$ (i=2k+1, $1<k<2^n-1$) refers to failures of odd bit-lines. The fault level can be obtained as in the case of single-tree structures.

Figure 6:
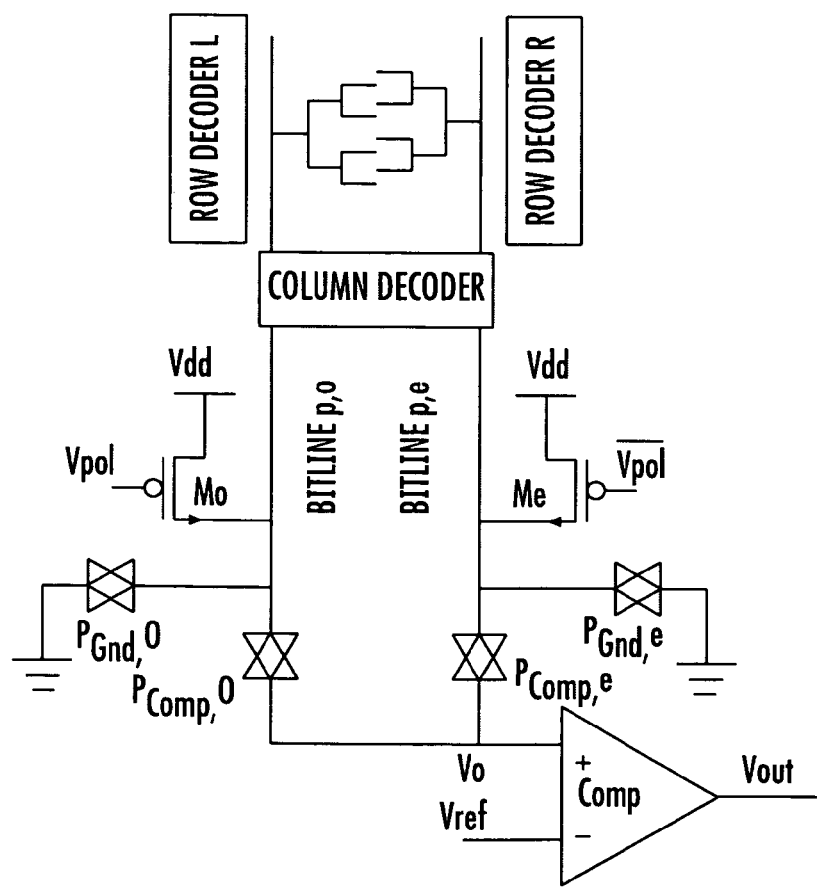
FIG. 6 is a basic scheme of the sensing architecture according to the present invention.

Read operations are carried out using a sense circuit topology as shown in FIG. 6. A reference current $I_{ref}$ (in the range of 10 μA) is forced into the selected odd-bit-line p,o through device $M_o$. The current flows through the selected path $P_{h,o}$, $P_{h,e}$ and reaches the associated even bit-line p,e, which is connected to ground by a switch $P_{gnd,e}$ (switch $P_{comp,e}$ is open).

Figure 7:
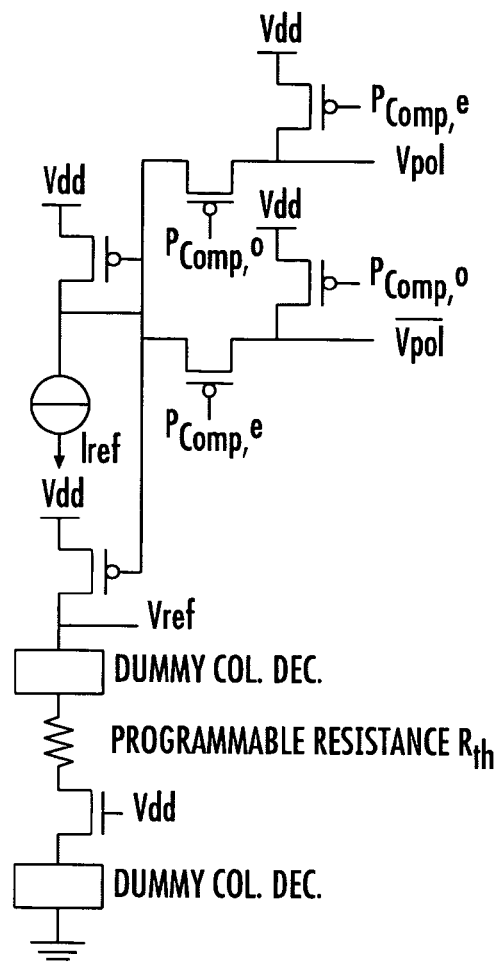
FIG. 7 is a circuit diagram of the reference structure according to the present invention.

The voltage $V_o$ that represents the voltage drop across the selected path (switches $P_{comp,o}$ and $P_{gnd,o}$ are closed and open, respectively) is compared to an adequate voltage $V_{ref}$, which is obtained by injecting the same current $I_{ref}$ into a reference path. As depicted in FIG. 7, the reference path is a replica of an array path and generates the phases $V_{pol}$ and $V_{pol}$ inverted and the current $I_{ref}$, and includes an additional resistance $R_{th}$. The value of the additional resistance $R_{th}$ is programmable for determining desired trigger point of the comparator Comp.

By adjusting the value of $R_{th}$, this will allow the threshold failure to be programmed. Moreover, the statistical distribution of the path resistance values can be obtained. Obviously, reading can also be accomplished by injecting the current $I_{ref}$ into the even bit-line through device $M_e$ (in this case, switches $P_{comp,e}$ and $P_{gnd,o}$ are closed, and switches $P_{comp,o}$ and $P_{gnd,e}$ are open). Since the dynamic range of the output voltage $V_o$ can vary from ground to $V_{DD}$, a rail-to-rail input swing comparator topology [11], [12] is used.

The electromigration failure test can be carried out by forcing different amounts of currents (e.g., up to 250 μA) into the bit-lines (and, hence, into the selected path) using a device $M_o$ (or $M_e$).

To measure the inter-metal leakage current, the row and the column decoders of the array can address the word-lines and bit-lines in several ways. For example, it is possible to force all word-lines to $V_{DD}$ and all bit-lines to ground. This allows the oxide leakage currents to be measured. Alternatively, the even and the odd word-lines can be forced to $V_{DD}$ and to ground, respectively, which allows a poly-to-poly leakage to be evaluated.

Figure 8:
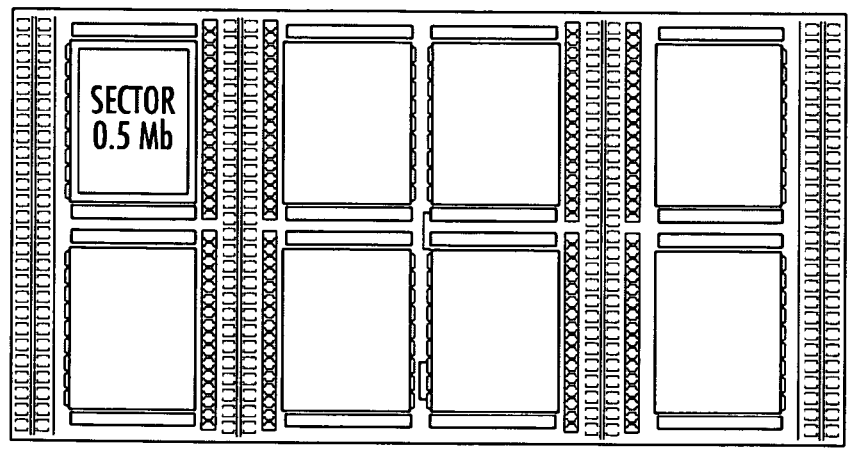
FIG. 8 is a picture of the layout of a test chip according to the present invention.

Metal-to-metal leakage may also be tested by forcing the even and the odd bit-lines to $V_{DD}$ and to ground, respectively. FIG. 8 is a picture of the test chip layout. Of course, the approach of this invention is to provide for a significant statistical analysis of problems that may arise because of different failure and degradation mechanisms that may affect the actual performance of contacts and vias produced by certain processing steps. This lends itself to a number of refinements for discriminating among the various failure and/or degradation mechanisms.

To assess the quality of contacts on p-type regions, on n-type regions, and on vias, three test chips may be used. Two distinct test chips may be employed for assessing and analyzing the quality of the contacts on p-type regions and on n-type regions. These two distinct test chips specifically dedicated to assessing the quality of contacts may be fabricated with only one metal level (metal 1), as it is normally done.

Then, according to the present invention, a further test chip will be fabricated with the multi metal pyramidal addressing structure for evaluation of vias, using for this test chip n-channel transistors to enhance sensitivity.

In a third test chip made according to the present invention, assuming that the cell area, for a 0.18 μm test array will be 0.7 μm², the area of a 16Mbit test chip will be about 15 mm². This allows testing of 16 million contacts, 8 million vias in metal 1, 4 million vias in metal 2, and so forth.

Optionally, beside the three test chips used to generate enhanced statistical data, two additional test chips, respectively for contacts on the P-type regions and for contacts on the N-type regions, with a lower statistic weight and proportionally with an increased sensitivity (for example, with a test array of one sixteenth of the total number of transistors of the main test chips and with a sixteen times enhanced sensitivity, by making the transistors sixteen times larger) may be used for investigating the range of design contact resistance from 100 to 1000 ohms.

The main advantage offered by the presented test chip is the possibility to perform failure evaluation for all the contact/via levels with the same chip. As a result silicon area and testing time are reduced.

REFERENCES

[1] G. E. Moore: "Cramming More Components Onto Integrated Circuits", *Electronics*, Vol. 38, No. 8, April 1965
[2] G. E. Moore: "Progress In Digital Integrated Electronics", *Tech. Digest. of IEEE Int. Electron Devices Meeting* (IEDM), 1975.
[3] J. D. Plummer, et al.: Silicon VLSI Technology—Fundamentals, *Practice and Models*, Prentice Hall, 1999, pp. 10-53.
[4] M. T. Bohr: "Nanotechnology Goals And Challenges For Electronic Applications", *IEEE Trans. On Nanotechnology*, Vol. 1, No. 1, March 2002, pp. 56-62.
[5] J. Gill, et al.: "Investigation Of Via-Dominated Multi-Modal Electromigration Failure Distributions In Dual Damascene Cu Interconnects", *Proc. of* 40 *th IEEE Int. Reliability Physics Symposium* 2002, pp. 298-304.
[6] T. Wada, et al.: "Study Of Electromigration At Interconnect Vias", *Proc. of IEEE Int. Conf. On Microelectronic Test Structures*, Vol.4, No.1, March 1990, pp. 251-256.
[7] E. T. Ogawa, et al.: "Statistics Of Electromigration Early Failures In Cu/Oxide Dual-Damascene Interconnects", *Proc. of* 39 *th IEEE Int. Reliability Physics Symposium*, 2001, pp. 341-349.
[8] R. Wilson: "Failures Plague 130-nm IC Processes", EE Times, www.eetimes.com, August 2002.
[9] K. Sekar, et al.: "LI-BIST: A Low-Cost Self-Test Scheme For SoC Logic Cores And Interconnects", *Proc. of* 20 *th IEEE VLSI Test Symposium* (VTS'02), pp. 417-422.
[10] K. Lippe, et al.: "A Test Chip For Automatic Reliability Measurements Of Interconnect Vias", *Proc. of* 30 *th IEEE Int. Reliability Physics Symposium*, 1992, pp. 247-250.
[11] J. H. Huijsing and D. Linebarger, "Low-Voltage Operational Amplifier With Rail-To-Rail Input And Output Ranges," *IEEE J. Solid-State Circuits*, vol. 20, December 1985, pp. 1144-1150.
[12] R. Hogervorst, et al: "A Compact Power-Efficient 3-V CMOS Rail-To-Rail Input/Output Operational Amplifier For VLSI Cell Libraries", *IEEE J. Solid-State Circuits*, Vol. 29, December 1994, pp. 244-245.

That which is claimed is:

1. A method for analyzing a quality of contacts and vias using a test chip, the test chip comprising a substrate; a plurality of contacts on the substrate and defining a zero level; and a test array on the substrate comprising a plurality of conductive levels and a plurality of individually selectable vias separating the plurality of conductive levels, each conductive level comprising a plurality of nodes with each node being connected to at least one individually selectable via, the plurality of conductive levels and the plurality of individually selectable vias forming a pyramidal interconnect structure so that an electrical path between a contact at the zero level and a node on one of the plurality of conductive levels includes at least one individually selectable via therebetween, the method comprising:

selecting an electrical path in the pyramidal interconnect structure between a contact at the zero level and a node on one of the plurality of conductive levels; and measuring an electrical resistance of the selected electrical path.

2. A method according to claim 1, further comprising comparing the measured electrical resistance to a reference threshold.

3. A method according to claim 1, wherein all possible electrical paths are selected and measured for obtaining a failure diagram for identifying locations of faulty contacts and vias.

4. A method according to claim 3, wherein the plurality of conductive levels is equal to n, with n being $\geq 2$, and there are F possible electrical path locations defined by $$F = \sum_{i=1}^{n} 2^i.$$

5. A method according to claim 1, wherein each contact is connected to a single individually selectable via; and wherein each node is connected to at least a pair of individually selectable vias.

6. A method according to claim 5, wherein the plurality of conductive levels is equal to n, with n being $\geq 2$, and any node on an nth conductive level is included in $2^n$ adjacent electrical paths.

7. A method according to claim 1, wherein the test chip further comprises a plurality of word lines connected between a column address decoder and the test array, and a plurality of bit lines connected between a row address decoder and the test array; the test array comprising a plurality of AND connected transistors, each transistor comprising a control terminal connected a word line and a pair of conducting terminals connected to a respective bit line.

8. A method according to claim 7, wherein the pair of conducting terminals for each transistor belong to a same column of the test array.

9. A method according to claim 7, wherein the array of AND connected transistors are separated into even and odd transistors; and wherein the row decoder comprises an odd decoder for selecting the odd transistors and an even decoder for selecting the even transistors.

10. A test chip for analyzing, a quality of contacts and vias, the test chip comprising:

a substrate;

an active area in said substrate, said active area comprising a plurality of contacts and defining a zero level;

a test array on said substrate comprising a plurality of conductive levels and a plurality of individually selectable vias separating said plurality of conductive levels, each conductive level comprising a plurality of nodes with each node being connected to at least one individually selectable via, said plurality of conductive levels and said plurality of individually selectable vias forming a pyramidal interconnect structure so that an electrical path between a contact at the zero level and a node on one of said plurality of conductive levels includes at least one individually selectable via therebetween;

row and column address decoders connected to said test array for selecting an electrical path between a contact at the zero level and a node on one of said plurality of conductive levels; and a sensing circuit for measuring an electrical resistance of the selected electrical path.

11. A test chip according to claim 10, wherein each contact is connected to a single individually selectable via; and wherein each node is connected to at least a pair of individually selectable vias.

12. A test chip according to claim 11, wherein said plurality of conductive levels is equal to n, with n being $\geq 2$, and any node on an nth conductive level is included in $2^n$ adjacent electrical paths.

13. A test chip according to claim 10, further comprising a plurality of word lines connected between said column address decoder and said test array, and a plurality of bit lines connected between said row address decoder and said test array; said test array comprising a plurality of AND connected transistors, each transistor comprising a control terminal connected a word line and a pair of conducting terminals connected to a respective bit line.

14. A test chip according to claim 13, wherein the pair of conducting terminals for each transistor belong to a same column of said test array.

15. A test chip according to claim 13, wherein said plurality of AND connected transistors are separated into even and odd transistors; and wherein said row decoder comprises an odd decoder for selecting said odd transistors and an even decoder for selecting said even transistors.

16. A test chip for analyzing a quality of contacts and vias, the test chip comprising:

an substrate;

an active area in said substrate, said active area comprising a plurality of contacts and defining a zero level;

a test array on said substrate comprising a plurality of conductive levels and a plurality of individually selectable vias separating said plurality of conductive levels, each conductive level comprising a plurality of nodes with each node being connected to at least one individually selectable via, said plurality of conductive levels and said plurality of individually selectable vias forming a pyramidal interconnect structure so that an electrical path between a contact at the zero level and a node on one of said plurality of conductive levels includes at least one individually selectable via therebetween;

a plurality of word lines connected to said test array, and a plurality of bit lines connected to said test array;

row and column address decoders respectively connected to said plurality of word lines and bit lines for selecting an electrical path between a contact at the zero level and a node on one of said plurality of conductive levels; and a sensing circuit for measuring an electrical resistance of the selected electrical path.

17. A test chip according to claim 16, wherein each contact is connected to a single individually selectable via; and wherein each node is connected to at least a pair of individually selectable vias.

18. A test chip according to claim 17, wherein said plurality of conductive levels is equal to n, with n being $\geq 2$, and any node on an nth conductive level is included in $2^n$ adjacent electrical paths.

19. A test chip according to claim 16, wherein said test array comprises a plurality of AND connected transistors, each transistor comprising a control terminal connected a respective word line and a pair of conducting terminals connected to a respective bit line.

20. A test chip according to claim 19, wherein the pair of conducting terminals for each transistor belong to a same column of said test array.

21. A test chip according to claim 19, wherein said plurality of AND connected transistors are separated into even and odd transistors; and wherein said row decoder comprises an odd decoder for selecting said odd transistors and an even decoder for selecting said even transistors.

\* \* \* \* \*